United States Patent
Li

(10) Patent No.: US 8,290,457 B2
(45) Date of Patent: Oct. 16, 2012

(54) PERFORMING IMPULSE BLANKING BASED ON BLOCKER INFORMATION

(75) Inventor: Junsong Li, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 347 days.

(21) Appl. No.: 12/767,962

(22) Filed: Apr. 27, 2010

(65) Prior Publication Data

US 2011/0261912 A1  Oct. 27, 2011

(51) Int. Cl.
H04B 1/10 (2006.01)
(52) U.S. Cl. ....... 455/223; 455/222; 455/296; 455/63.1; 455/501; 375/278; 375/296; 375/346
(58) Field of Classification Search .................. 455/501, 455/63.1, 570, 114.2, 222, 223, 296; 375/278, 375/296, 346
See application file for complete search history.

(56) References Cited

U.S. PATENT DOCUMENTS

| | | | |
|---|---|---|---|
| 4,345,241 A | 8/1982 | Takeuchi et al. | |
| 6,347,146 B1 * | 2/2002 | Short et al. ....................... | 381/15 |
| 6,744,829 B1 | 6/2004 | Mohindra | |
| 6,959,016 B1 | 10/2005 | Keeth et al. | |
| 7,158,586 B2 | 1/2007 | Husted | |
| 2005/0135521 A1 | 6/2005 | Nemer et al. | |
| 2005/0243949 A1 | 11/2005 | Khoini-Poorfard | |
| 2007/0049227 A1 * | 3/2007 | Su ................................. | 455/223 |
| 2008/0261549 A1 * | 10/2008 | Altizer ........................... | 455/223 |

OTHER PUBLICATIONS

Keng Leong Fong, et al., "High-Frequency Nonlinearity Analysis of Common-Emitter and Differential-Pair Transconductance Stages," IEEE Journal of Solid State Circuits, vol. 33, No. 4, pp. 548-555. Apr. 1998.
Keng Leong Fong, et al., "A Class AB Monolithic Mixer for 900 MHz Applications," IEEE Journal of Solid Stae Circuits, pp. 1166-1172, Aug. 1997.
Keng Leon Fong, et al., "2.4 Monolithic Mixer for Wireless LAN Applications," IEEE Custom Integrated Circuits Conference, pp. 9.41-9.4.4, May 1997.
Stefaan Van Gerven, et al., "Signal Separation by Symmetric Adaptive Decorrelation: Stability, Convergence, and Uniqueness," IEEE Transactions on Signal Processing, vol. 43, No. 7, Jul. 1995, pp. 1602-1612.
Fred Harris, "Digital Filter Equalization of Analog Gain and Phase Mismatch in I-Q Receivers," 1996, pp. 793-795.
Stefaan Van Gervan, et al., "On the Use of Decorrelation in Scalar Signal Separation," IEEE, 1994, pp. 57-60.
Mikko Valkama, et al., "Advanced Methods for I/Q Imbalance Compensation in Communication Receivers," IEEE Transactions on Signal Processing, vol. 49, No. 10, Oct. 2001, pp. 2335-2344.

(Continued)

Primary Examiner — Tuan Pham
(74) Attorney, Agent, or Firm — Trop, Pruner & Hu, P.C.

(57) ABSTRACT

One aspect of the present invention is directed to an apparatus to perform impulse blanking of a received signal at multiple locations of a signal processing path. To effect such impulse blanking, multiple impulse detectors and blankets may be present, in addition to other circuitry. The impulse detectors may operate at different bandwidths, and the impulse blankers may be located at different locations of the signal processing path and may be differently configured.

12 Claims, 7 Drawing Sheets

OTHER PUBLICATIONS

Supisa Lerstaveesin, et al., "A Complex Image Rejection Circuit with Sign Detection Only," IEEE Journal of Solid-State Circuits, vol. 41, No. 12, Dec. 2006, pp. 2693-2702.

U.S. Appl. No. 12/493,738, filed Jun. 29, 2009, entitled "Providing Image Rejection Calibration for a Receiver," by John Khoury, et al.

U.S. Appl. No. 12/317,786, filed Dec. 30, 2008, entitled "Controllable Image Cancellation in a Radio Receiver," by Junsong Li.

U.S. Appl. No. 12/623,641, filed Nov. 23, 2009, entitled "Mitigating Radio Receiver Multipath Noise," by Junsong Li.

* cited by examiner

PERFORMING IMPULSE BLANKING BASED ON BLOCKER INFORMATION

BACKGROUND

Many different types of radio receivers are available. Conventionally, receivers were formed of various discrete components and implemented within a desired type of solution such as a desktop radio in the form of a clock radio, an integrated radio within a stereo receiver, a portable receiver such as a handheld receiver, or a mobile receiver such as incorporated in a car stereo.

As technology has advanced, radio receivers have begun to be implemented within semiconductor integrated circuits. In this way, much smaller radio solutions are possible to enable implementation of radios within smaller devices such as MP3 players, cellular telephones such as smart phones and so forth. In addition, semiconductor advances can provide improved audio quality by way of signal processing techniques.

One issue with regard to radio signals can be the presence of impulse noise. Impulse noise can occur due to various sources of interference within a radio frequency (RF) signal or a downconverted frequency to which an RF signal is converted. To remove impulse noise, an impulse blanker can be provided in a radio receiver. Different types of blankers use different mechanisms to remove impulse noise. However, in the presence of a close-in blocking signal such as an adjacent radio channel, impulse noise can distort the desired audio signal. Due to the presence of a close-in blocker, known impulse blankers do not operate well and accordingly are either turned off, or if allowed to continue to operate, can cause much distortion of the audio signal.

SUMMARY OF INVENTION

According to one aspect of the present invention, an apparatus which may a radio receiver or a device including such receiver, may perform impulse blanking at multiple locations of a signal processing path. To effect such impulse blanking, multiple impulse detectors and blankers may be present, in addition to other circuitry.

In one embodiment, a first impulse detector may be configured to receive a desired signal corresponding to a desired channel and detect an impulse present in a blocking spectrum adjacent the desired channel. A first impulse blanker may be configured to receive the desired signal and blank an impulse present in the blocking spectrum. A second impulse detector downstream of the first impulse detector may be configured to receive an output of the first impulse blanker and detect an impulse present in the blocking spectrum. A second impulse blanker may be located downstream of the first impulse blanker to receive the desired signal and blank an impulse present in the desired signal. Still further, a third impulse blanker can be coupled to receive the desired signal (which may be filtered by a prechannel filter) and blank an impulse present in the desired signal.

Each of the blankers may be enabled for operation based on detection of a blocker signal within the blocking spectrum. To realize the detection, a blocker analyzer may be coupled to receive the desired signal and an image signal and detect presence of one or more blocker signals in the blocking spectrum. Still further, a controller coupled to the blacker analyzer may receive information regarding the presence of the blocker signal(s) and generate one or more control signals to enable a selected one of the impulse blockers.

Another aspect of the present invention is directed to a method for performing impulse blanking. The method may include determining whether at least one blocker signal is present in a blocking spectrum surrounding a desired radio channel, and performing blanking based on the determination. In one embodiment, if no blocker signal is present, a wideband impulse detector can be used to determine whether impulse noise is present in the blocking spectrum, and impulse blanking can be performed using a first impulse blanker of a signal processing path. If at least one blacker signal is present and outside of an N+/−1 channel, a narrowband impulse detector can be used to determine whether impulse noise is present in the desired radio channel, and the impulse blanking can be performed using a second impulse blanker of the signal processing path. If a blocker signal is present within the N+/−1 channel, the wideband impulse detector can be used to determine whether the impulse noise is present, and the impulse blanking can be performed using a third impulse detector.

Yet another aspect of the present invention is directed to a system including an antenna to receive a radio frequency (RF) signal and a radio receiver coupled to the antenna to receive and process the RF signal to output an audio signal. The radio receiver may include an analog front end to receive the RF signal and downconvert the RF signal to a baseband signal, an analog-to-digital converter (ADC) to convert the baseband signal to a digitized signal, and a digital signal processor (DSP) to receive and demodulate the digitized signal and to provide a digital audio output. In this implementation, the DSP may include a signal processing path having multiple impulse blankers each to be selectively enabled based on presence and location of one or more blocker signals in a blocking spectrum adjacent to a desired signal channel.

DETAILED DESCRIPTION

In various embodiments, impulse noise can be detected and removed to enable improved radio reception. To dynamically control impulse noise reduction, embodiments may provide for multiple impulse detectors and multiple impulse blankers. In some implementations, selection of which blanker to enable may be based on the presence and location of one or more blocking channels around a desired signal channel. Furthermore, dynamic control of actual impulse blanking by the selected blanker can be based on detection of impulse noise in a relevant part of a radio spectrum by an associated impulse detector.

Figure 1:
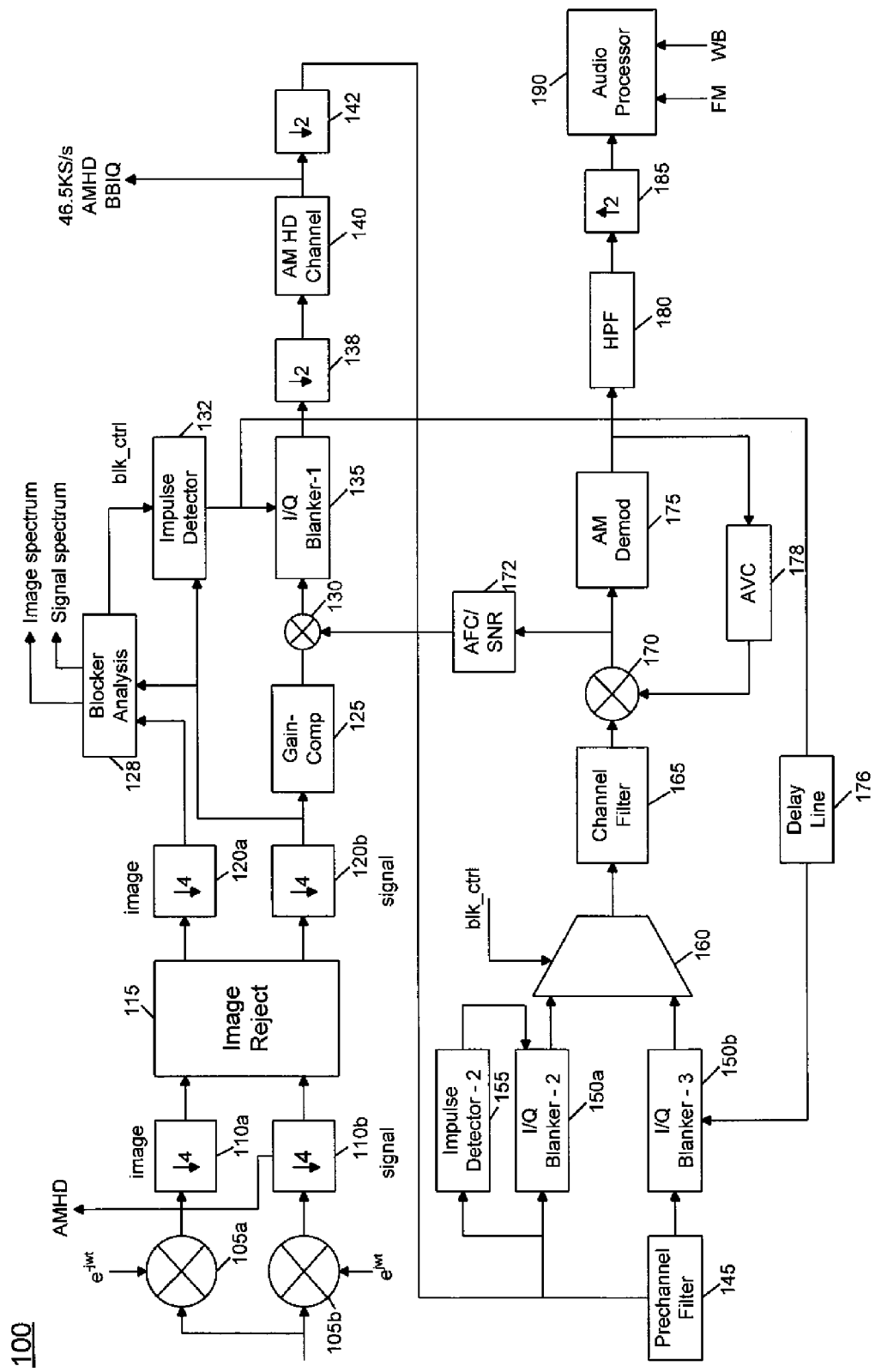
FIG. 1 is a block diagram of a digital signal processor (DSP) in accordance with one embodiment of the present invention.

Referring now to FIG. 1, shown is a block diagram of a portion of a digital signal processor in accordance with one embodiment of the present invention. As shown in FIG. 1, DSP 100 may be part of a single die semiconductor device including both analog and digital circuitry. As an example, a complementary metal oxide semiconductor (CMOS) die can be a mixed-signal device to handle receipt and processing of incoming RF signals. In different implementations, the receiver may be a multi-band receiver such as an amplitude modulation (AM)/frequency modulation (FM)/weatherband (WB) receiver, although the scope of the present invention is not limited in this regard. Note that the full receiver signal processing path is not shown for ease of illustration in FIG. 1. Instead, FIG. 1 is directed only to the DSP portion of the receiver, as techniques in accordance with an embodiment of the present invention may be performed within a DSP or other programmable logic. An analog front end including various filtering, mixing, signal processing and analog-to-digital conversion circuitry may be present to receive and process an RF signal before providing it to the DSP. While not shown for ease of illustration, also understand that the DSP may be part of a multi-function device including both receive and transmit capabilities. In addition, the receiver may include a storage such as a non-volatile storage including software, firmware, or combinations thereof to enable the DSP or other circuitry to operate in AM/FM/WB modes, and may further enable transmission as well as reception operations.

As shown in FIG. 1, the DSP signal processing path may receive incoming I and Q signals at a relatively high sampling rate (e.g., at 1.488 mega samples per second (Ms/s)). These incoming signals may be at an intermediate frequency (IF) and may be provided to a pair of complex mixers $105_a$ and $105_b$ of image and signal paths, each of which mixes the incoming I and Q signals with a corresponding mixing signal. The downmixed signals, which may be I and Q signals of the desired channel signal and an image signal at baseband, may be decimated in a corresponding decimator $110_{a/b}$, which may reduce the sampling rate to a lower rate. For example, in the embodiment shown a decimation by four may be performed to realize sampled signals at a lower rate of 744 kilo samples (ks/s). As seen, the desired channel signal also may be provided from the signal path to a separate AM high definition (HD) processor (where present), which may perform various processing and demodulation.

The signals of both the image and signal paths may be provided to an image rejection unit 115 that may perform image rejection. In turn, the resulting signals may be provided to another decimator 120. As seen, the decimated image signal may be provided to a blocker analysis unit 128, while the decimated signal path signal may be provided to a gain compensation unit 125 and to a first impulse detector 132, in addition to the blocker analysis unit.

In general, blocker analysis unit 128 may determine the location of blacker signals within a blocking spectrum. That is, in many environments, radio channels may be relatively closely adjacent to each other due to the number of radio stations present in a local environment. For example, in the context of the AM band, different radio stations may be located as close as 9 or 10 kilohertz (kHz) apart. If the strength or energy of an adjacent channel is large enough, it can bleed into the desired signal channel, causing various noise and other signal degradation issues. As used herein, a "blocking spectrum" is a frequency spectrum around a desired signal channel, both on image and signal sides of the channel. To determine the presence of blocking signals within the blocking spectrum, blocker analysis unit 128 may employ a mixer. In addition to determining the presence of these blocking signals, analysis unit 128 may determine approximate energy or strength of the these signals, e.g., via an RSSI analysis.

This information regarding the location and approximate strength of any blocking signals, both on the signal side and image side of a desired channel may be provided to, e.g., a controller such as a microcontroller unit (MCU) (not shown in FIG. 1 for ease of illustration), which may in turn generate control signals to cause a selected blanker to be enabled based on the location of blocker signals within the blocking spectrum. In turn, the controller may issue various control signals, both to enable a selected blanker, as well as to provide various settings for operation of the blanker. Such settings may include threshold information, width of blanking and so forth. In addition, the controller may also send control signals to control operation of blocker analysis unit 128. For example, such control signals may set the blocker analysis unit for a given part of a blocking spectrum (e.g., bandwidth of an image or signal side and so forth). Note that in some embodiments, control of settings and so forth via the microcontroller can be set by a customer, e.g., a radio manufacturer incorporating a receiver in accordance with an embodiment of the present invention.

Based on the information received from the blocker analysis unit, the MCU or other controller may determine an appropriate location to perform impulse blanking. That is, based upon the presence and strength of blocking signals with respect to a desired signal channel, impulse blanking can be performed in a selected one of multiple blankets.

Different considerations may come into play in determining an appropriate blanker for performing blanking. As described further below in an implementation with multiple blankers, each can occupy a location at a different point of a signal processing path. For example, a first blanker can be located earlier in the signal path, before additional decimation and filtering is performed, and thus such blanking occurs at a higher sample rate and wider bandwidth. Instead other blankers can be located further along the signal processing path and perform blanking at a lower sampling rate and narrower bandwidth. In addition, a third blanker may perform its blanking on a filtered signal, owing to the presence of a very close-in blanking signal, e.g., a N+/−1 blocker. Further details regarding selection of an appropriate blanker will be described below.

As discussed above, the desired channel signal output from decimator $120_b$ is further provided to first impulse detector 132. In general, an impulse detector may operate to determine the presence of impulse noise. While such impulse noise can come from various sources, in the context of an automotive environment, impulse noise may occur throughout a radio spectrum due to various operations occurring in a car, including various communications among car components, engine noise, and other spurious noise occurring due to operation of other car systems. In general, an impulse detector may determine the presence of such noise and, when it is greater than a threshold level, provide an output signal to indicate the presence of undesired impulse noise that should in turn cause blanking to be performed in the respective blanker. In one embodiment, this output signal may be in the form of a digital control signal, e.g., a flag or enable signal which is of a first level to indicate the presence of impulse noise (and thus to cause blanking to occur) and a second level to indicate the lack of such noise (at least exceeding a threshold level) (and thus to disable the blanker from blanking).

Still referring to FIG. 1, the resulting gain compensated signal path signal output from gain compensation block 125 may be provided to another mixer 130, where it may be fine frequency adjusted to obtain a tuned signal using a mixing signal from an automatic frequency control (AFC)/signal-to-noise ratio (SNR) controller 172. The tuned signal may be provided to a first blanker 135 which performs impulse blanking to provide a blanked signal (when enabled) to a decimator 138, the output of which is channel filtered in a channel filter 140. Note that the blanking performed by impulse blanker 135 may be at a relatively wide bandwidth (e.g., 20 to 30 kHz) such that impulse noise throughout a blanking spectrum may be removed. In one embodiment, first blocker 135 may generally operate as a sample-and-hold circuit such that when enabled, a current, impulse noise-affected sample can be replaced with a prior, clean sample. When not enabled, the output from first blanker 135 may be the original sample received by the blanker, delayed according to the setting of the sample-and-hold circuit. The channel filtered output from channel filter 140 may be provided to another decimator 142, in addition to be being provided to a separate AM HD processor, if present.

The resulting decimated signal, which may be at a sampling rate of, e.g., 23.25 ks/s, is provided to a pre-channel filter 145, a second impulse detector 155, and a second blanker 150$_a$. The resulting pre-channel filtered signal from pre-channel filter 145 may be provided to a third blanker 150$_b$. As seen, the output of second impulse detector 155 may be provided to second blanker 150$_a$, while the output of first impulse detector 132 may be provided to both first blanker 135 and third blanker 150$_a$. Note that the blanking performed by the second and third blankers may be at a lower sampling, and thus at a narrower bandwidth such that the impulse noise being blanked may be substantially in the desired radio channel itself.

In general, the second and third blankers may be configured similarly to the first blanker. While the second and third blankers may be similarly configured to blank impulse noise via a sample and hold operation, these blankers may be triggered under different conditions. In one embodiment, the triggering of a selected blanker may be based on the location of a blocking signal within the blocking spectrum. While the selection of which blanker to use can be based on controller selection, the actual blanking may occur under control of the appropriate impulse detector. Thus as shown in FIG. 1, first impulse detector 132 provides a blanking control signal both to first blanker 135 and to third blanker 150$_b$ (via delay line 176, which controls the timing of delivery of the blanking control signal from first impulse detector 132 to third blanker 150$_b$ to correspond to the timing of receipt of the impulse noise detected sample in third blanker 150$_b$). Instead, second blanker 150, receives its blanking control signal from second impulse detector 155. Thus, only a single blanker will be enabled at any given time based on the combination of blanking control signals from the corresponding impulse detector and control signals from the controller, which in turn are based on identification of blocker signal location within the blocking spectrum.

As further shown in FIG. 1, the outputs of second blanker 150, and third blanker 150$_b$ are provided to a multiplexer 160, the output of which is controlled based on a blanking control signal (e.g., from the MCU) to be used on the location of a blocking signal. The resulting output is then channel filtered in a channel filter 165 and provided to a multiplier 170, where it is multiplied with an output of an automatic volume control (AVC) unit 178, acting in feedback loop. The resulting volume-controlled signal is used to control AFC/SNR unit 172 and to provide a signal to a demodulator 175, which demodulates the signal. The resulting demodulated signal is provided in feedback to AVC unit 178 and to a high pass filter 180, which filters the resulting magnitude information and provides it to an interpolator 185, which in one embodiment may increase the sampling rate, e.g., by two, to provide signals to an audio processor 190 at a sampling rate of, e.g., 46.5 ks/s. This audio processor may perform various audio processing on the demodulated signals for this AM path, as well as for other radio paths which may be present in the DSP, e.g., FM or weatherband. While shown with this particular implementation in the embodiment of FIG. 1, the scope of the present invention is not limited.

Figure 2:
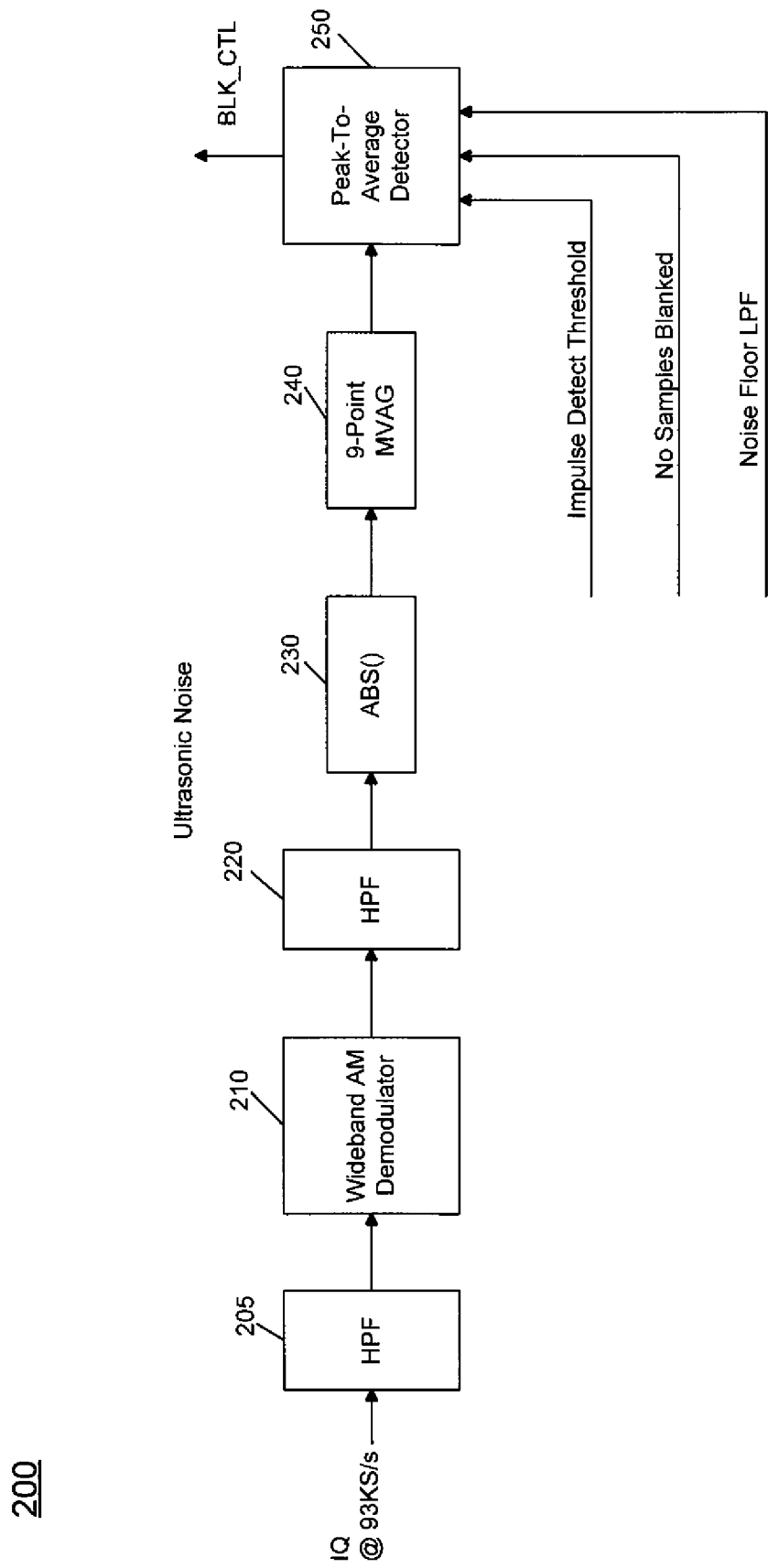
FIG. 2 is a block diagram of an impulse detector in accordance with one embodiment of the present invention.

Referring now to FIG. 2, shown is a block diagram of an impulse detector in accordance with one embodiment of the present invention. In one embodiment, this impulse detector 200 may correspond to the first impulse detector shown at FIG. 1 and thus may be used to act upon incoming signals that are of a relatively wide bandwidth, e.g., 20-30 kHz. As seen, the incoming complex signals are provided first to a high pass filter (HPF) 205 and then onto a wideband demodulator 210, which demodulates the signals and provides them to a filter 220 which in one embodiment may be a third-order infinite impulse response (IIR) HPF. The resulting filtered signal, which corresponds to ultrasonic noise present in the signal channel signal, may be provided to an absolute value function 230, which determines an absolute value of the ultrasonic noise, the output of which is provided to a moving average generator (block 240). In one embodiment, unit 240 may be a 9-point moving average detector. The resulting output, which may be representative of a magnitude of the ultrasonic noise over a number of samples (e.g., a 9 sample range) is provided to a detector 250, which in one embodiment may be a peak-to-average detector.

As seen, various control information may also be provided to the detector, including a threshold value (Impulse Detect Threshold), to which the incoming magnitude may be compared. When the magnitude received from unit 240 is greater than this threshold, the presence of a blocker is detected. As such, a blanking control signal may be output, e.g., to one or more blankers. In one embodiment, the blanking control signal may be a digital signal that acts as a flag such that when impulse noise is greater than the threshold the signal is at a first logic level and instead when the impulse noise is less than the threshold this signal is of a second logic level. Accordingly, on receipt by the corresponding blanker, the signal to be output by the blanker is either the current sample or a prior clean sample, based on whether the blanking control signal is of the first or second logic level. For example, in one implementation assume that a digital control signal of logic 1 indicates the presence of impulse noise. In this case, when the digital control signal is received in a corresponding blanker at this logic level, a prior clean sample will be output by the blanker instead of a current sample, which may be impulse noise impacted.

In addition, a received control signal (Number of Samples Blanked), which determines how many samples can be blanked upon detection of an impulse event, may also be provided to the detector, along with a programmable LPF filter setting, which is used to estimate the noise floor. While shown with this particular implementation in the embodiment of FIG. 2, understand that an impulse detector can take other forms in different embodiments.

Figure 3:
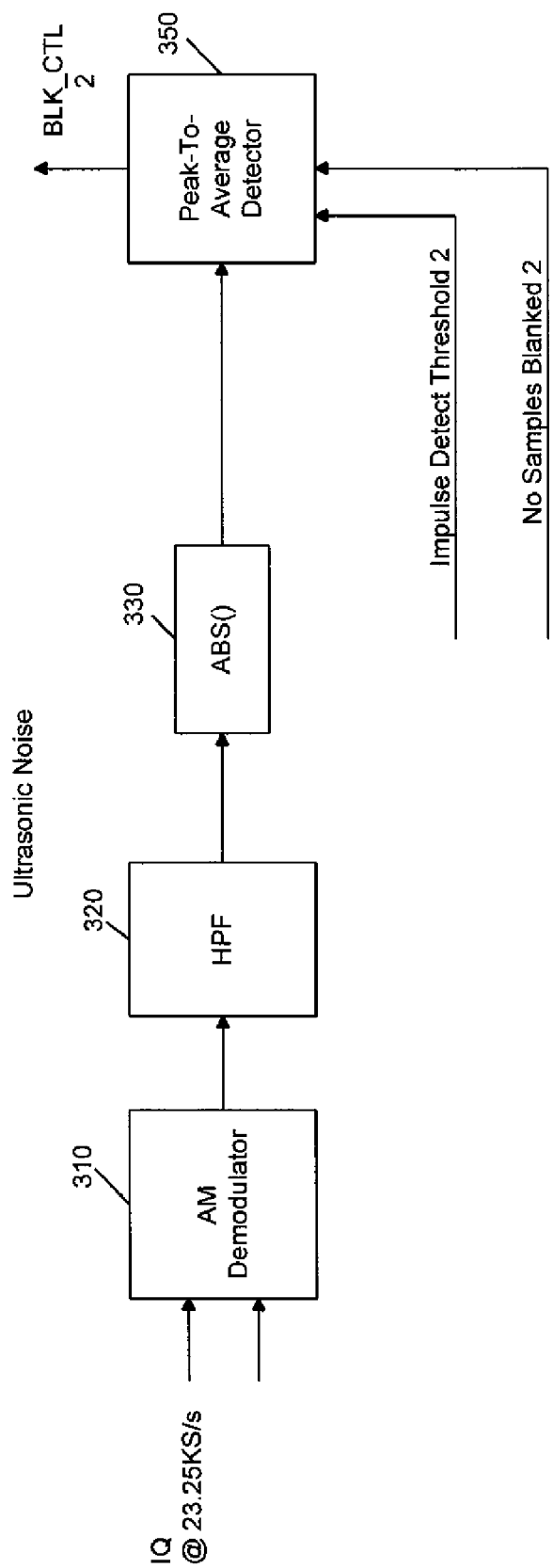
FIG. 3 is a block diagram of another impulse detector in accordance with an embodiment of the present invention.

Referring now to FIG. 3, shown is a block diagram of an impulse detector in accordance with another embodiment of the present invention. Impulse detector 300 of FIG. 3 may correspond to the second impulse detector of FIG. 1 and thus may be configured at a narrower bandwidth to handle the incoming signals that are at a narrower bandwidth and slower sample rate. As seen, the incoming signals, which have already been processed in a signal path such as the front end part of the signal path of FIG. 1, may be provided to a demodulator 310. The resulting demodulated signals may be provided to a filter 320 which in one embodiment may be a second-order IIR high pass filter to thus pass along ultrasonic noise to an absolute value function 330. The resulting absolute value of the detected ultrasonic noise may be provided to a detector 350, which may be another peak-to-average detector. There, the incoming magnitude information may be compared to another threshold. When the absolute value is greater than this threshold, the blanking control signal will cause blanking to occur. In addition, control information (Number of Samples Blanked 2) that is used to control blanking in certain instances may also be provided to detector 350. The output of detector 350 is thus another blanking control signal, which is used to control the blanking which occurs in a corresponding blanker. With reference back to FIG. 1, this blanking control signal may be used to control second blanker $150_a$. While shown with this particular configuration in the embodiment of FIG. 3, the scope of the present invention is not limited in this regard.

In one embodiment, control of which blanker is enabled for operation may be based on the detections performed as to close-in channels occurring in a blocking spectrum. While the scope of the present invention is not limited in this regard, the blocking spectrum may correspond to some number of channels on both the desired signal side and image signal side of a desired channel. For example, in one embodiment, the blocking spectrum may correspond to at least channels N−3, N−2, N−1, and N+1, N+2 and N+3, where N is the desired signal channel.

Figure 4:
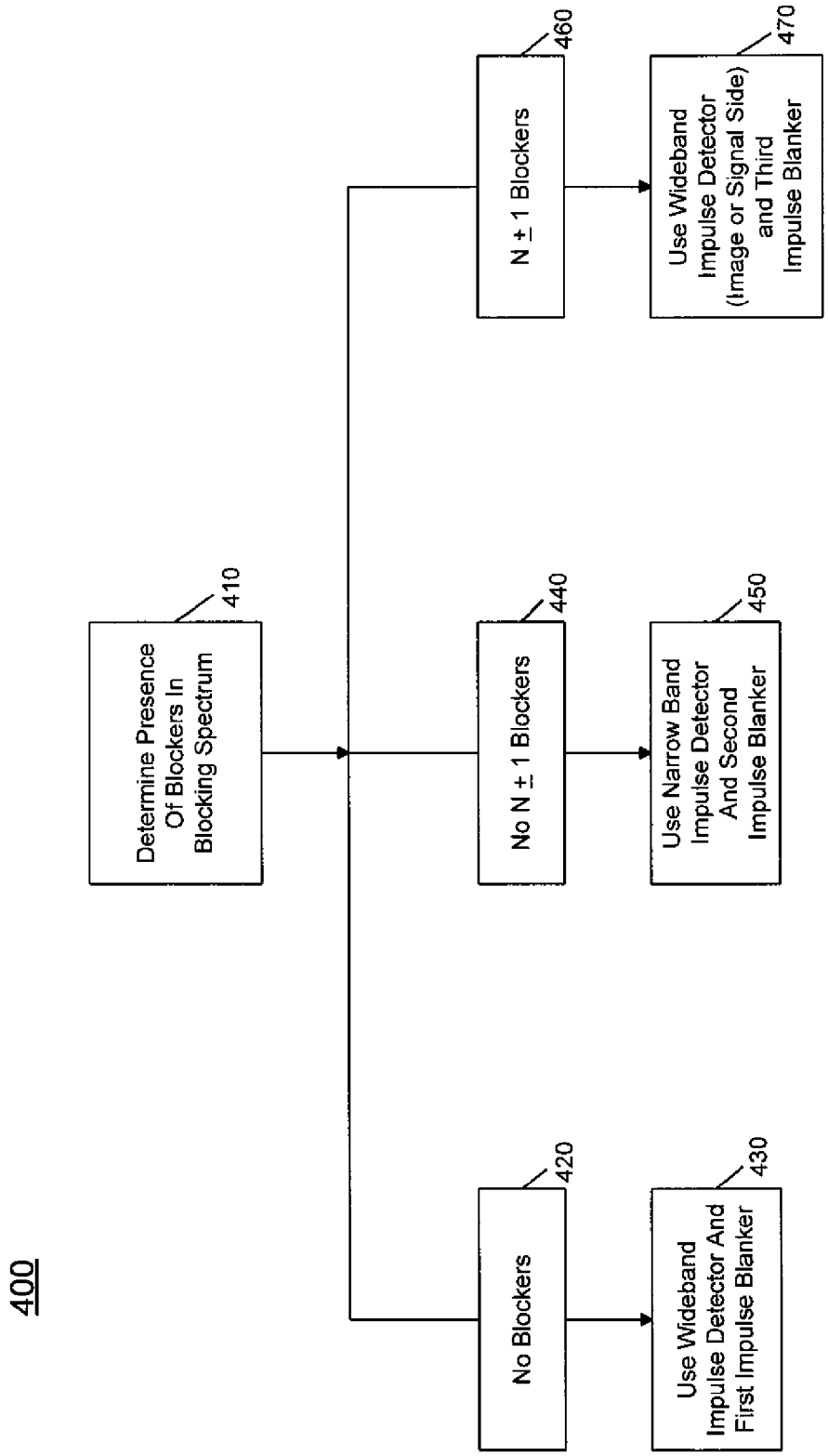
FIG. 4 is a flow diagram of a method in accordance with one embodiment of the present invention.

Referring now to FIG. 4, shown is a flow diagram of a method in accordance with one embodiment of the present invention. Method 400 may be implemented, e.g., via a controller such as a MCU or other such controller to perform impulse blanking control in accordance with an embodiment of the present invention. In general, method 400 of FIG. 4 may be used to determine the presence of blockers and to select an impulse detector and blanker to perform impulse blanking. Basically, method 400 is implemented by selecting the appropriate detector and blanker based on the location and/or signal strength of closely located blockers. In general if there is no blocker in the blocking spectrum, the first blanker, which operates at wideband and high speed may be selected. As a result of the higher bandwidth, the impulse noise can be quite well compensated, so blanking at this point can realize a clear cut, such that a very small amount of samples need to be blanked. In contrast, when a closer-in blanker is present, blanking occurs at a lower rate (e.g., downstream in the second or third blanker), and the impulse becomes more spread out such that more blanking is needed.

As seen in FIG. 4, method 400 may begin by determining the presence of blockers in a blocking spectrum (block 410). While the scope of the present invention is not limited in this regard, in one embodiment a blocking spectrum may have a bandwidth of approximately 70-80 kilohertz in the context of an AM band. The determination of the presence of blockers may be based on signals received from a signal processing path that receives an incoming radio spectrum. For example, a spectrum analyzer may be used to analyze the blocking spectrum to detect the presence of one or more blocking signals and their relative strength.

Then as seen, a selected one of multiple paths may be traversed based on the detected blockers. In some instances, no blockers may be detected (as shown in block 420). Accordingly, a wideband impulse detector may be used and impulse blanking may occur using a first impulse blanker (block 430). In other instances, one or more blockers may be present within the blocking spectrum, but not very closely adjacent to a desired signal channel. That is, such blockers may be present outside of an N+/−1 channel (block 440). Accordingly, because the channel is not very close to the desired signal channel, control can pass to block 450 where a narrow band impulse detector and a corresponding second impulse blanker are enabled. If instead the presence of an N+/−1 blocker is detected (block 460) control passes to block 470, where the wideband impulse detector is used to control blanking performed by a third impulse detector.

Note that in the presence of a possibly strong, closely adjacent blocker, the wideband impulse detector may be run using only a portion of the spectrum, e.g., an image side only. For example, assume that an N+1 blocker is detected. As this signal exists on the signal side of the desired channel (e.g., within approximately +10 kHz of the desired channel), for purposes of wideband impulse detection, the image side of the desired signal channel (e.g., having frequencies larger than the desired channel) may be used for performing impulse detection. This is so, as generally the impulse noise will be relatively evenly spread out across the entirety of the blanking spectrum. While shown with this particular implementation in the embodiment of FIG. 4, the scope of the present invention is not limited in this regard.

Figure 5:
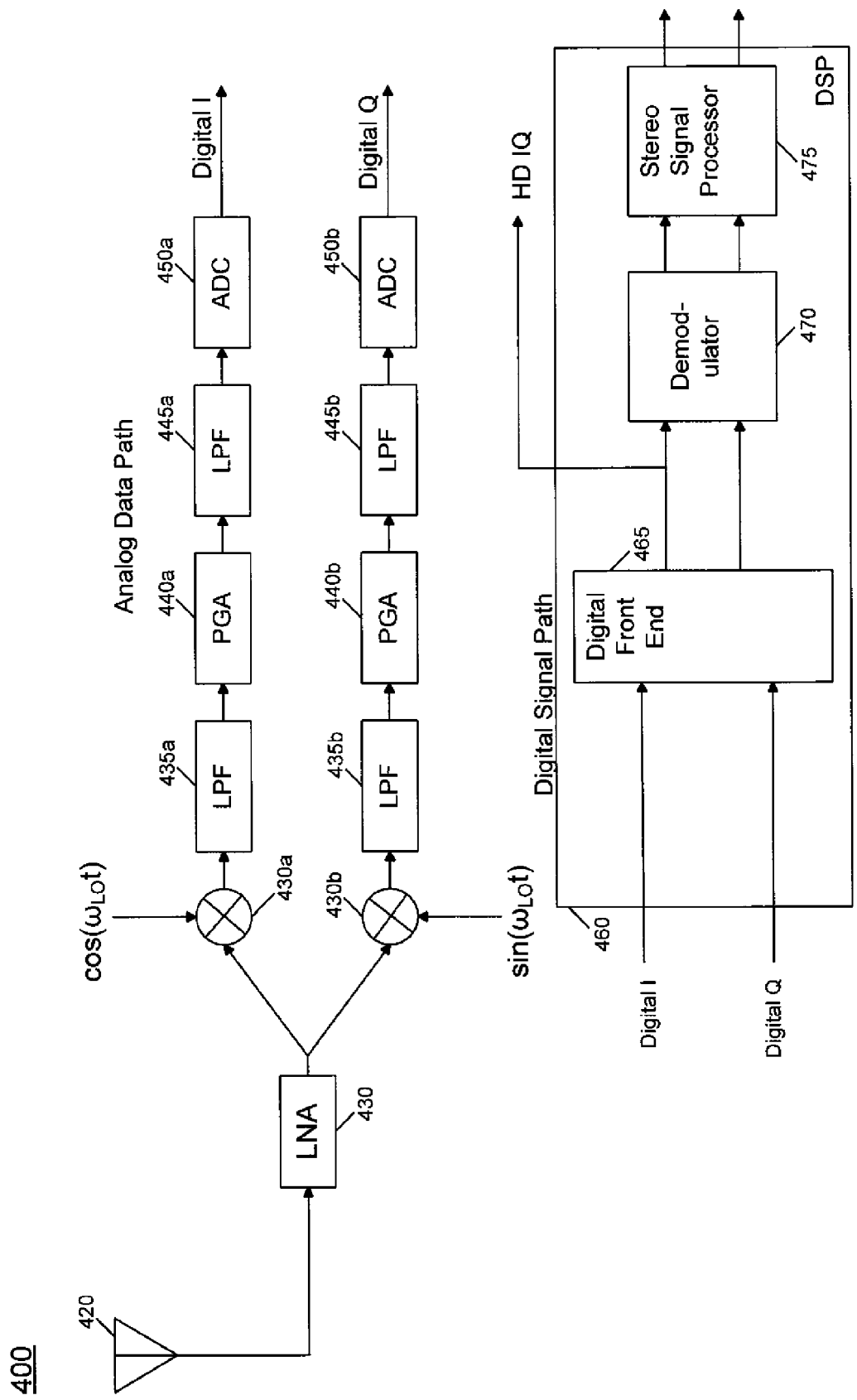
FIG. 5 is a block diagram of a receiver in accordance with one embodiment of the present invention.

Embodiments may be implemented in many different types of receivers including receivers having a DSP-based signal processor. Referring now to FIG. 5, shown is a block diagram of a receiver in accordance with one embodiment of the present invention. As shown in FIG. 5, receiver 400 may be of a low-intermediate frequency (IF) receiver architecture. In the embodiment of FIG. 5, receiver 400 is coupled to receive an RF signal via an antenna 420 that in turn is coupled to a low noise amplifier (LNA) 430. In turn, the RF signal may be provided to mixers $430_a$ and $430_b$. As seen in FIG. 5, the receiver may have a complex signal architecture having separate in-phase (I-phase) and quadrature (Q-phase) phases, such that separate paths for I and Q-phases are provided. This is realized by mixers 430, each of which mix the received RF signal with a local oscillator (LO) frequency at different phases, namely 90° apart. In the embodiment of FIG. 5, mixers 430 may mix the incoming signal with a local oscillator frequency to generate an IF signal. In various implementations, this IF signal may be between approximately 120 and 250 kilohertz (kHz). For example, in one embodiment, for FM/AM/WB the IF signal can be fixed at 120 kHz, while for high definition (HD) audio it can be fixed at 250 kHz, although the scope of the present invention is not limited in this regard.

Various analog processing may then be performed on the IF signals. Specifically, each of the I and Q paths may include a first LPF 435, a programmable gain amplifier (PGA) 440 and a second LPF 445. The resulting signal is then provided to an analog-to-digital converter (ADC) 450, which converts the analog IF signals to digital I and Q signals, which may then be provided to a digital portion of the receiver. Note that while in many implementations receiver 400 may be configured as a single integrated circuit, e.g., a CMOS device configured on a single semiconductor die, the scope of the present invention is not limited in this regard.

The digital information may be provided to a digital portion of the receiver which may include a DSP 460 having a digital front end 465 that may perform various digital processing to prepare the signals for demodulation in a demodulator 470, which may thus demodulate the signals and provide demodulated data to a desired location. This processing may include impulse detection and blanking in accordance with an embodiment of the present invention. In addition, DSP 460 may include a stereo signal processor 475 that may perform stereo and other processing on the demodulated signals.

While shown with this particular implementation in the embodiment of FIG. 5, the scope of the present invention is not limited in this regard.

Figure 6:
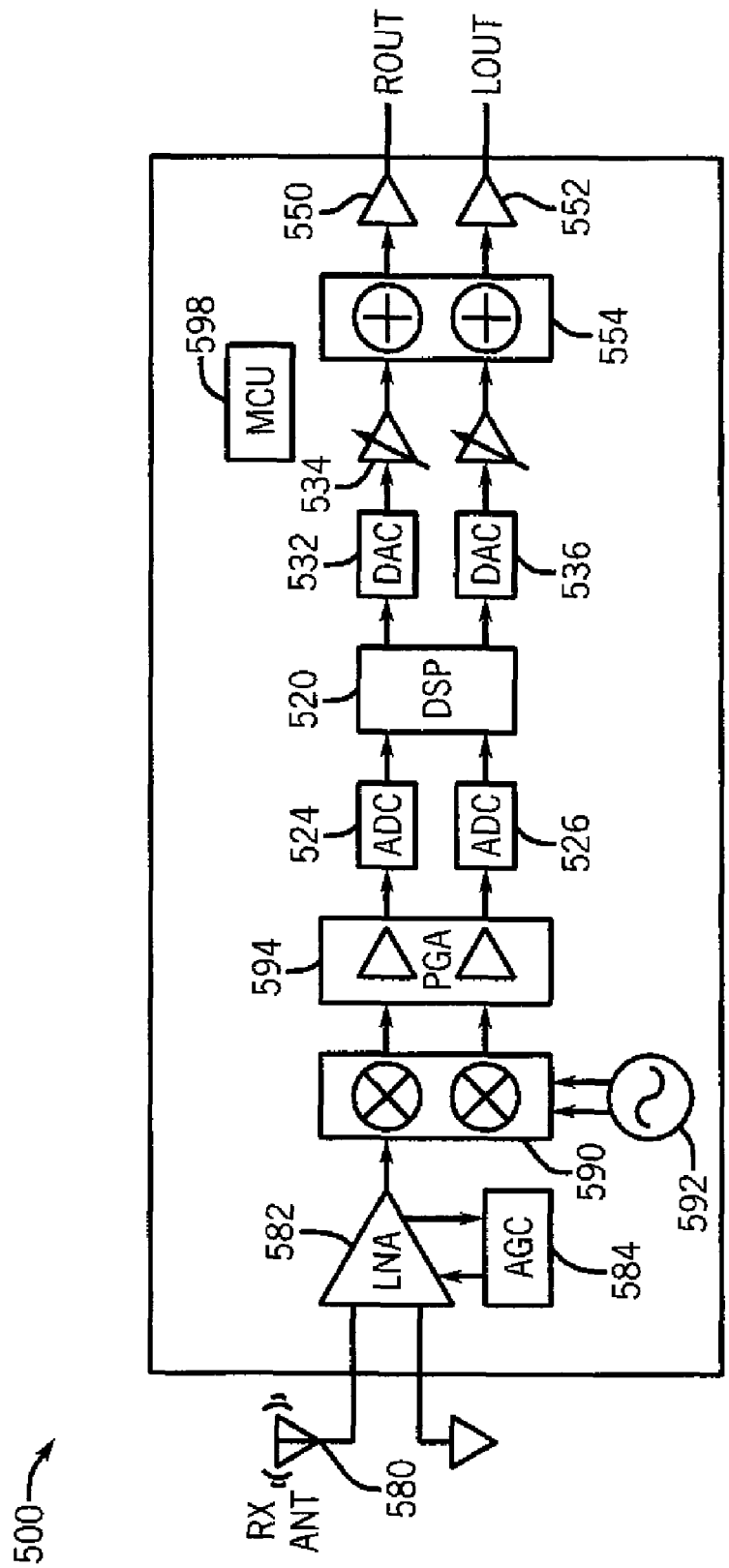
FIG. 6 is a block diagram of a multi-band receiver system in accordance with an embodiment of the present invention.

Embodiments may be implemented in many different receivers, transceivers and so forth. In some implementations, a radio receiver capable of both AM and FM receive modes, among others, may implement embodiments of the present invention. Referring now to FIG. 6, shown is a block diagram of a multi-band receiver system 500 in accordance with an embodiment of the present invention. In one embodiment, system 500 may be a mobile radio such as a car radio. As shown in FIG. 6, a multimode combined AM/FM/WB receiver 500 may be fabricated on a monolithic semiconductor die.

An incoming RF signal is received from an external receive antenna 580 through a LNA 582 controlled by an automatic gain control (AGC) circuit 584. After processing, left channel (called "LOUT") and right channel (called "ROUT") analog stereo signals appear at output terminals 552 and 550, respectively.

The multimode receiver 500 includes analog mixers 590 that are coupled to a tunable local oscillator 592, the frequency of which selects the desired radio channel to which the receiver 500 is tuned. In response to the incoming RF signal, the mixers 590 produce corresponding analog IF, quadrature signals that pass through PGAs 594 before being routed to the ADCs 524 and 526. Thus, the ADCs 524 and 526 convert the analog IF quadrature signals from the PGAs 594 into digital signals, which are provided to a DSP 520.

The DSP 520 demodulates the received complex signals and processes them as described above to provide corresponding digital left and right channel stereo signals at its output terminals; and these digital stereo signals are converted into analog counterparts by DACs 532 and 536, respectively, which are coupled to programmable gain amplifiers 534. A microcontroller unit (MCU) 598 may perform control operations for setting a mode of operation and control of controllable features of the receiver, such as the controllable impulse detection and blanking described above.

Figure 7:
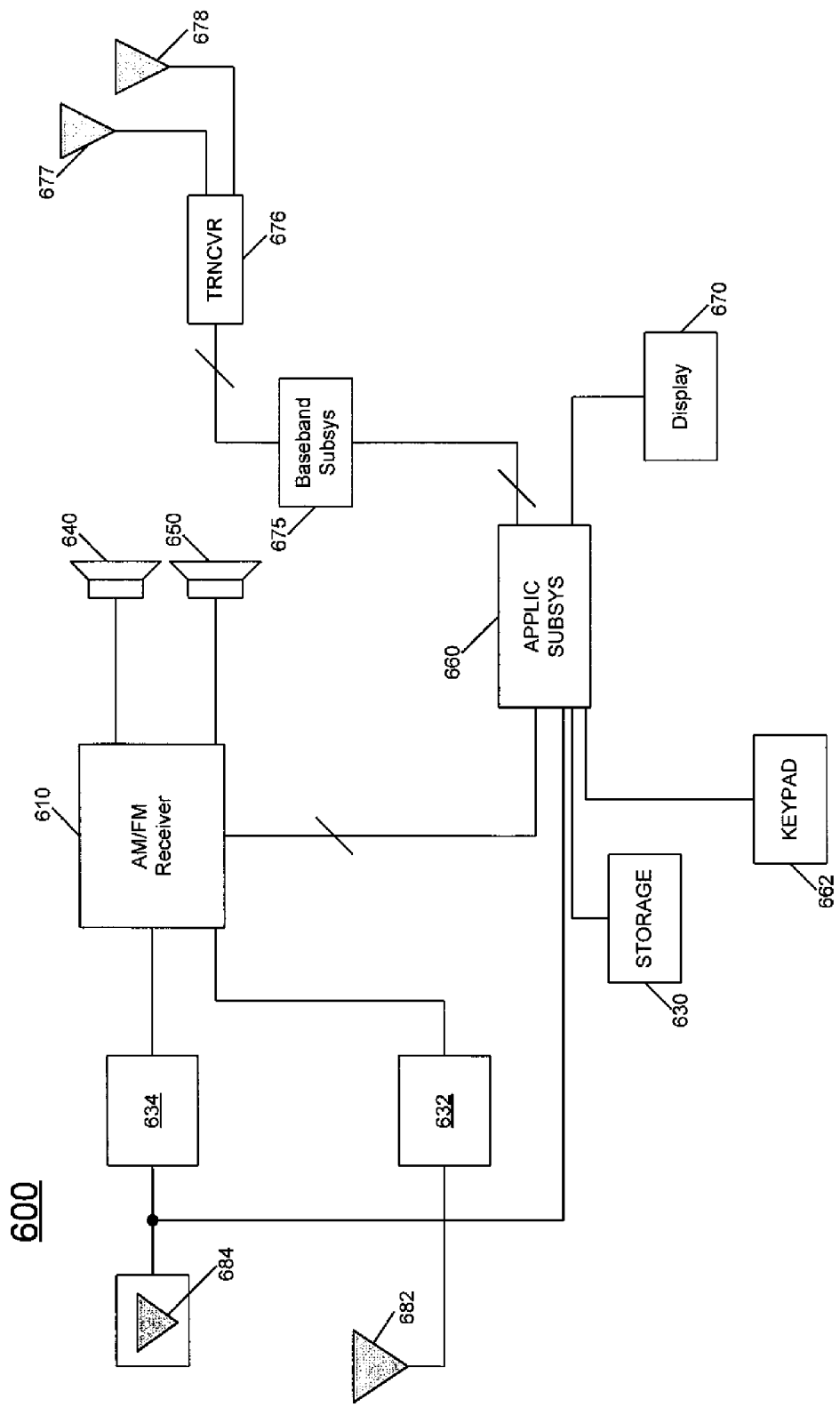
FIG. 7 is a block diagram of a system in accordance with one embodiment of the present invention.

Referring to FIG. 7, in accordance with some embodiments of the invention, an AM/FM receiver 610 (such as an implementation of that shown in the embodiment of FIG. 6) may be part of a multimedia device 600. As examples, the device 600 may be an automobile entertainment system, a portable wireless device such as a dedicated MP3 player, a cellular telephone or PDA with audio capabilities, or other such devices.

Among its other functions, the device 600 may store digital content on a storage 630, which may be a flash memory, hard disk drive, or an external device such as a portable media player, as a few examples. The device 600 generally includes an application subsystem 660 that may, for example, receive input from a keypad 662 of the device 600 and display information on a display 670. Furthermore, the application subsystem 660 may generally control the retrieval and storage of content from the storage 630 and the communication of, e.g., audio with the AM/FM receiver 610. As shown, AM/FM receiver 610 may be directly connected to speakers 640 and 650 for output of audio data. As depicted in FIG. 7, the AM/FM receiver 610 may be coupled by a matching network 632 to an FM receiver antenna 682 and may be coupled by a matching network 634 to an AM receiver antenna 684, which can be tunable or programmable, e.g., via application subsystem 660 that provides control information to control matching network 634.

In accordance with some embodiments of the invention, device 600 may also have the ability to communicate over a communications network, such as a cellular network. For these embodiments, the device 600 may include a baseband subsystem 675 that is coupled to the application subsystem 660 for purposes of encoding and decoding baseband signals for this wireless network. Baseband subsystem 675 may be coupled to a transceiver 676 that is connected to corresponding transmit and receive antennas 677 and 678.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first impulse detector to receive a desired signal corresponding to a desired channel and to detect an impulse present in a blocking spectrum adjacent the desired channel;
   a first impulse blanker to receive the desired signal and to blank an impulse present in the blocking spectrum, the first impulse blanker to be operable when no blocker signal is detected in the blocking spectrum;
   a second impulse detector downstream of the first impulse detector to receive an output of the first impulse blanker and to detect an impulse present in the blocking spectrum;
   a second impulse blanker downstream of the first impulse blanker to receive the desired signal and to blank an impulse present in the desired signal, the second impulse blanker operable when at least one blocker signal is detected in the blocking spectrum;
   a prechannel filter to receive the desired signal and to filter the desired signal; and
   a third impulse blanker coupled to the prechannel filter to receive the filtered desired signal and to blank an impulse present in the desired signal, the third impulse blanker operable when at least one blocker signal is detected in a first portion of the blocking spectrum.

2. The apparatus of claim 1, further comprising:
   a blocker analyzer coupled to receive the desired signal and an image signal and to detect presence of one or more blocker signals in the blocking spectrum; and
   a controller coupled to the blocker analyzer to receive information regarding the presence of the one or more blocker signals and to generate a first control signal to enable a selected one of the first, second and third impulse blockers.

3. The apparatus of claim 2, wherein the controller is to generate the first control signal to enable the first impulse blanker when no blocker signal is detected in the blocking spectrum.

4. The apparatus of claim 3, wherein the controller is to generate the first control signal to enable the second impulse blocker when a blocker signal is detected in the blocking spectrum.

5. The apparatus of claim 4, wherein the controller is to generate the first control signal to enable the third impulse blanker when a N+/−1 blocker signal is detected in the blocking spectrum.

6. The apparatus of claim 1, wherein the first impulse detector is to generate a blanking control signal to be provided to an input of the first impulse blanker and to the third impulse blanker, and one of the first and third impulse blankers is to perform the blanking responsive to the blanking control signal.

7. The apparatus of claim 1, wherein an output of the second impulse detector is coupled to an input of the second impulse blanker, and the second impulse blanker is to blank the impulse responsive to the output.

8. The apparatus of claim 1, wherein the second impulse blanker is to be enabled when a blacker signal is detected within the blanking spectrum.

9. The apparatus of claim 8, wherein the third impulse blanker is to be enabled and the second impulse blanker is to be disabled when the blocker signal is detected within a first range of the blanking spectrum, the first range corresponding to a N−1 or N+1 signal band with respect to the desired channel.

10. The apparatus of claim 1, further comprising a digital signal processor (DSP) including the first, second, and third impulse blankers.

11. The apparatus of claim 1, wherein the first impulse detector comprises:
   a first filter to filter an incoming complex signal;
   a wideband demodulator to demodulate the filtered incoming complex signal;
   a second filter to filter the demodulator output;
   a computation unit to generate an average of a number of samples of the demodulator output; and
   a peak detector to compare the average to a first threshold, wherein the peak detector is to cause one of the first or third impulse blankers to perform the blanking when the average is greater than the first threshold.

12. The apparatus of claim 1, wherein the second impulse detector comprises:
   a second demodulator to demodulate the output of the first blanker;
   a high pass filter to filter the desired channel from the demodulator output; and
   a second detector to compare the filtered demodulator output to a second threshold, wherein the peak detector is to cause the second impulse blanker to perform the blanking when the filtered demodulator output is greater than the second threshold.

* * * * *